United States Patent [19]

Saito et al.

[11] Patent Number: 4,660,181

[45] Date of Patent: Apr. 21, 1987

[54] MEMORY SYSTEM

[75] Inventors: Mitsuo Saito, Arlington, Mass.; Takeshi Aikawa, Chofu; Akio Mori, Tokyo, both of Japan

[73] Assignee: Kabushiki Kaisha Toshiba, Kawasaki, Japan

[21] Appl. No.: 714,396

[22] Filed: Mar. 21, 1985

[30] Foreign Application Priority Data

Mar. 24, 1984 [JP] Japan .................................. 59-055273

[51] Int. Cl.$^4$ .............................................. G11C 8/00
[52] U.S. Cl. ...................................... 365/230; 365/189
[58] Field of Search ........................ 365/189, 230, 233

[56] References Cited

U.S. PATENT DOCUMENTS 4,376,988  3/1983  Ludwig et al. ................. 365/189 X
4,472,792  9/1984  Shimohigashi et al. ............. 365/189

FOREIGN PATENT DOCUMENTS 57-179982  11/1982  Japan .

Primary Examiner—Joseph A. Popek
Attorney, Agent, or Firm—Schwartz, Jeffery, Schwaab, Mack, Blumenthal & Evans

[57] ABSTRACT

A memory system includes a memory which consists of a plurality of bit memory cells each capable of being independently accessible and of storing bit data in at least a first and a second different predetermined bit width access mode. A multiplexer and address decoder are provided together with a bit width register for producing first and second write control signals corresponding to the first and second access modes respectively for enabling writing within the independently accessible memory cells of data having respectively first and a different second bit width.

6 Claims, 7 Drawing Figures

MEMORY SYSTEM

BACKGROUND OF THE INVENTION

1. Field of the Invention

The present invention relates to a memory system used for a picture display device or the like, and more particularly to a memory system adapted for realizing fast access to the desired bits within a word.

2. Description of the Prior Art

When making access (writing or reading) to a memory for data (e.g., picture dots) which constitutes a figure or a letter to represent a variety of figures and letters in a picture display, the number of dots that are accessed at one time varies depending upon the kind of figure. For example, in displaying a letter, a picture image, or the like, it is desired to access all the dots that make up the letter or the picture image at one time. On the other hand, in displaying a geometrical figure such as a straight line, a circle, or the like, it will be easier for a human observer to view it as being described gradually one dot at a time. Now, although there is available a prior art memory device which is capable of giving access to a word made up of a plurality of bits corresponding to one address, the number of accessible bits is fixed. Because of this, when an access is desired to a width which is smaller than the fixed bit width, it has been necessary to read out the entire bits within the word once, rewrite only the portion of the desired width, and write in again the whole thing without touching the other portions. In short, this method has a disadvantage of requiring a complicated procedure for rewriting and a longer time for processing. On the other hand, it is possible to construct a memory so as to allow access one bit at a time. However, such an arrangement also has a disadvantage of requiring a long time since the access is possible only one bit at a time. As a device which eliminates such disadvantages, there has been known one as is disclosed in Japanese Patent Publication No. 57-179982. This memory device is adapted for rewriting all of the bits or a part of the bits in a word by dividing the word into groups of n bits, and comprises a memory circuit with write or read units of n bits (n=1, 2, 3, . . . ), a data input terminal with N bits ($N=1 \times n$, $1=2, 3, 4, \ldots$), a data selection circuit which selects n bits from the N-bit data that are inputted through the input terminal, an input terminal for a control signal which indicates together with the write indication signal whether all of the N bits or n bits of the N bits are to be rewritten, an input terminal for an address information for the memory circuit, an internal address generating circuit which outputs l kinds of data selection signals to the data selection circuits based on the control signal input through the input terminal and outputs the write indication signal and l kinds of internal address (the addresses for the n bits in the word) to the memory circuit for l times as well and an output terminal. In the above memory circuit, the N bits in the word with address i are divided into groups of n bits which are memorized at the l addresses at $i+0, i+1, \ldots, i+(l-1)$. First, when all of the N bits in the word with address i are to be rewritten, the internal address generating circuit outputs sequentially l kinds of internal addresses and l kinds of data selection signals to the memory circuit and the data selection circuit based on the control signal at the input terminal respectively, and outputs the write indication signal to the memory circuit for l times as well, which accomplishes the rewriting of all of the N bits with address i in the memory circuit. However, even in this case where all of the N bits are desired to be rewritten, it takes a longer time and hence is inefficient since the rewriting has to be done sequentially in a group of n bits. When only n bits of the N bits in the word with address i are to be rewritten, the internal address generating circuit outputs, based on the control signal at the input terminal, l kinds of data selection signals and the specified internal addresses in address i that are generated sequentially for l times to the data selection circuit and the memory circuit, respectively, and outputs as well the write indication signal to the memory circuit for l times. In this case, it is very inefficient since the data for the n bits outputted from the data selection circuit are written for l times to the specified n bits in address i of the memory circuit, and only the data for the n bits which were written for the last, that is, the l-th, time are memorized. Moreover, in the example cited in the above, internal addresses, signals, data selection signals, and write indication signals, in addition to the address information, have to be inputted so that the control for their synchronization has also been complicated.

SUMMARY OF THE INVENTION

An object of the present invention is to provide a memory device which is adapted for qiving a fast access to the desired bits in a word.

Another object of the present invention is to provide a memory device which is adapted for shortening the time for processing an access.

Another object of the present invention is to provide a memory device whichis adapted for giving access to the desired bits in a word simultaneously.

Briefly described, these and other objects of the present invention are accomplished by the provision of an improved memory device which includes a memory comprising of a plurality of small memories, each of which being equipped independently with a signal line for data input and output and a signal line for write control for being commonly supplied with an address signal which indicates the word to be accessed to memorize the data for a plurality of bits in each of these small memories separately, a bit width designation means for supplying to the memory a first designation signal which designates the writing in the unit of word or a second designation signal which indicates the writing in the unit of at least one bit that constitutes each word, a means for supplying the bit address and write data to indicate the bits to be written in the word that is indicated by the address signal, and a write control means for outputting write control signals to all of the signal lines for write control of the small memories in accordance with the first designation signal which is supplied by the bit width designation means and to outputting write control signals only to those signal lines for write control that correspond to the bit addresses in accordance with the second designation signal.

BRIEF DESCRIPTION OF THE DRAWING

These and other objects, features and advantages of the present invention will be more apparent from the following description of a preferred embodiment, taken in conjunction with the accompanying drawing, in which:

FIG. 1b is a construction diagram illustrating the internal structure of the memory of the memory device shown in FIG. 1a;

DESCRIPTION OF THE PREFERRED EMBODIMENTS

To facilitate the understanding of the present invention, a brief reference will be made to a prior art memory device illustrated in FIGS. 1a and 1b.

Figure 1A:
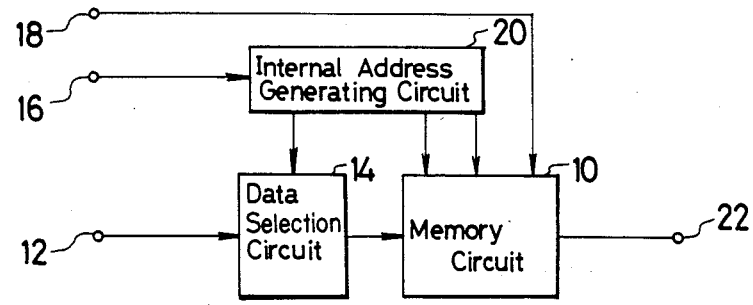
FIG. 1a is a simplified construction diagram of a prior art memory device.
Figure 1B:
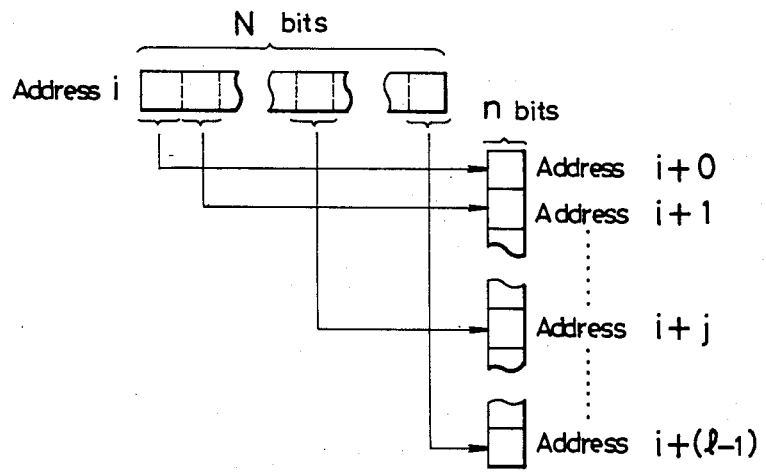

As shown in FIG. 1a, the prior art memory device comprises a memory circuit 10 with write and read unit of n bits (n=1, 2, 3, ...), a data input terminal 12 with N bits ($N = 1 \times n$, 1=2, 3, 4, ...), a data selection circuit 14 which selects n bits from the N-bit data that are inputted through the input terminal 12, an input terminal 16 for a control signal which indicates together with the write indication signal whether all the N bits or n bits of the N bits are to be rewritten, an input terminal 18 for an address information for the memory circuit 10, an internal address generating circuit 20 which outputs, l kinds of data selection signals to the data selection circuit 14 based on the control signal input through the input terminal 16, and outputs the write designation signal and l kinds of internal address (the address for the n bits in the word) to the memory circuit for l times as well, and an output terminal 22. In the memory circuit 10, the N bits in the word with address i are divided into groups of n bits which are memorized at the l addresses at i+0, i+1, ..., i+(l−1) as shown in FIG. 1b. Now, when all of the N bits of the word with address i are to be rewritten, the internal address generating circuit 20 outputs sequentially, based on the control signal at the input terminal 16, l kinds of internal addresses and l kinds of data selection signals to the memory circuit 10 and the data selection circuit 14, respectively, and outputs the write designation signal to the memory circuit 10 for l times as well, which completes the rewriting of all of the N bits with address i in the memory circuit 10. However, even in this case where rewriting of all of the N bits are desired, it takes a longer time and hence is inefficient since the rewriting has to be done sequentially in a group of n bits. Next, when only n bits in the N bits of the word with address i are to be rewritten, the internal address generating circuit 20 outputs, based on the control signal at the input terminal 16, l kinds of data selection signals and the specific internal addresses in address i that are generated sequentially for l times to the data selection circuit 14 and the memory circuit 10, respectively, and outputs as well the write designation signal to the memory circuit for l times. In this case, the data for the n bits which are outputted from the data selection circuit 14 are written l times to the specified n bits in address i of the memory circuit 10 and only the l-th data that are written in for the last time are memorized, so that the efficiency is very low. Moreover, in the example cited, the internal address signals, the data selection signals, and the write designation signals, in addition to the address information, have to be inputted, which makes the control for their synchronization a complicated task.

The present invention which is aimed at resolving problems like those mentioned above will be described by referring to FIGS. 2 to 5.

Figure 2:
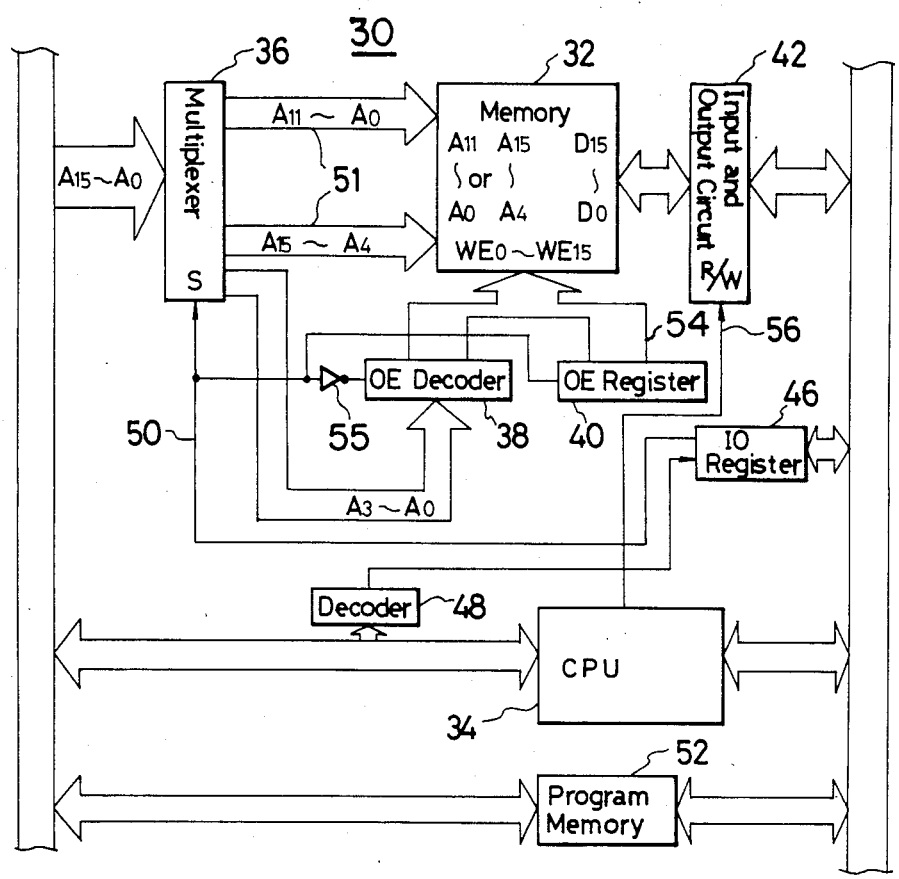
FIG. 2 is a construction diagram of a memory device embodying the present invention.

Referring to FIG. 2, a memory device embodying the present invention is shown with reference numeral 30, which is incorporated in a picture generating device which is connected to a display.

The memory device 30 includes a memory 32 for storing the dot data to be presented in the display, and the memory 32 is capable of writing and reading 16 dots at one time as a word, and is capable as well of writing in the unit of one bit (corresponding to one dot data) constituting 16 bit word.

In the present embodiment, the memory 32 is constructed by 4k words × 16 bits. The memory device 30 includes further a multiplexer 36 which selectively switches and outputs the 16-bit addresses ($A_0$–$A_{15}$) that are sent from a CPU 34 in accordance with the bit number (bit width) to be accessed. The multiplexer 36 outputs to the memory 32, $A_0$ to $A_{11}$ when the bit width to be accessed is 16 bits (a word unit), and $A_4$ to $A_{15}$ when the width is one bit. That is, word addresses are sent from the CPU 34 using $A_0$ to $A_{11}$ in the case of an access with 16-bit width, and using $A_4$ to $A_{15}$ in the case of an access with 1-bit width. Furthermore, in the 1-bit width case, the lower addresses $A_0$ to $A_3$ are utilized for selecting the bit positions to be accessed in the word addresses designated by $A_4$ to $A_{15}$. A decoder 38 receives, in the case of an access with 1-bit width, address $A_0$ to $A_3$ from the multiplexer 36, and outputs a write control signal for designating one bit to be accessed in the 16 bits (one word) designated by $A_4$ to $A_{15}$. A register 40 is used for obtaining a write control signal which is required in the case of access with 16-bits width. An input and output circuit 42 is adapted for sending to the memory 32 the data sent through the data bus or for reading the data in the memory 32, according to control signal from an R/W signal line 56. When a write control signal is supplied, all the data for 16 bits are sent to the bits ($D_0$ to $D_{15}$) of the memory 32 in the case of 16-bit width, and the identical data for 16 bits sent from the data bus are sent to all the bits ($D_0$ to $D_{15}$) of the memory 32 in the case of 1-bit width. An IO register 46 supplies, in accordance with the control signal from the CPU 34, a bit width designation signal in response to the control signal from a decoder 48. The memory device 30 further includes a program memory 52 and an inverter 55 which inverts the bit width designation signal on the bit width designation signal line 50 to be supplied to the decoder 38.

Figure 3:
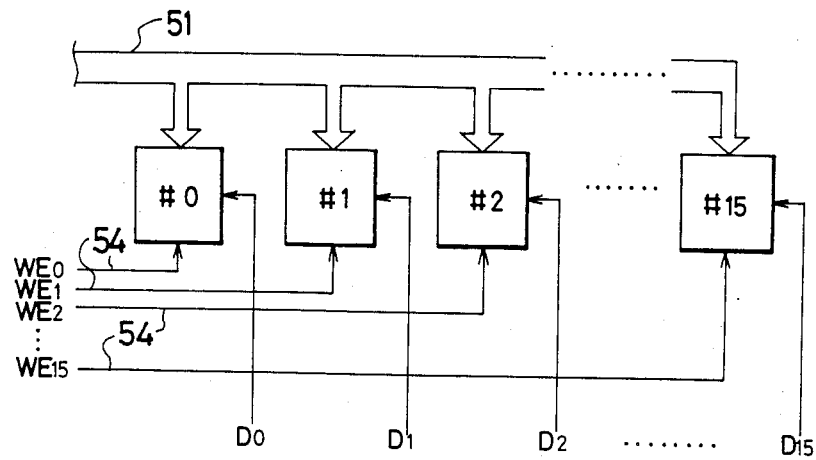
FIG. 3 is a construction diagram illustrating the internal structure of the memory device shown in FIG. 2.
Figure 3:
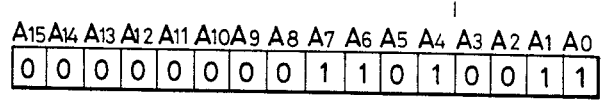

FIG. 3 is an internal construction diagram of the memory 32 which is constructed by small memories #0 to #15 to which respectively the write enable signal lines $WE_0$ to $WE_{15}$ and the data lines $D_0$ and $D_{15}$ are connected. Each of these small memories is constructed of 4k bits to which are assigned 4k addresses, and an identical address is supplied to all of them. That is, each bit of each word is stored respectively in an independent small memory.

Next, the writing operation of the embodiment will be described. Suppose that addresses $A_0$ to $A_{15}$ are sent from the CPU 34. When a signal which designates a 16 bit width (call this signal "1") is inputted to the multiplexer 36 from an IO register 46 in accordance with a control signal from the CPU 34, the multiplexer 36 outputs only addresses $A_0$ to $A_{11}$ to the memory 32.

Here, the addresses $A_{12}$ to $A_{15}$ are not utilized. Then, the words in the memory 32 that corresponds to the addresses $A_0$ to $A_{11}$ are chosen. The signal "1" that is inputted to the bit width designation signal line 50 is sent also to the register 40. When the signal "1" is inputted to the register 40, it turns on all of the write enable signal lines 54 that are connected to each of the small memories #0 to #15 in the memory 32. The CPU 34 sends out to the data bus the data for 16 bits which are then supplied to the input and output circuit 42. Upon receipt of a write control signal from the CPU 34 through the R/W signal line 56, the input and output circuit 42 inputs the data for 16 bits to the 16 bits ($D_0$ to $D_{15}$) of the memory 32. The data signal for the 16 bits ($D_0$ to $D_{15}$) are sent to the small memories #0 to #15 where the data are written in since there is inputted the write enable signal to each of these small memories.

Next, a description will be given of the case when a signal which designates a 1-bit width (this will be called signal "0") is inputted to the multiplexer 36 through the bit width designation signal line 50 from the IO register 46 in accordance with an indication from the CPU 34. In this case, the multiplexer 36 outputs only the word addresses $A_4$ to $A_{15}$ to the memory 32, while the lower addresses which represent the bit addresses $A_0$ to $A_3$ are sent to the decoder 38. The signal "0" that is inputted through the bit width designation signal line 50 is inverted by the inverter 55 to signal "1", and is sent to the decoder 38.

Therefore, the decoder 38 interprets the input addresses $A_0$ to $A_3$ and turns on the corresponding write enable signal (one among $WE_0$ to $WE_{15}$). On the other hand, the data to be written into the corresponding one bit is sent through the data bus simultaneously, as identical data for the 16 bits. The input and output circuit 42 inputs the identical data for the 16 bits to the 16 bits ($D_0$ to $D_{15}$) of the memory 32 in accordance with the write indication signal from the R/W signal line 56.

Although an identical data is inputted to the small memories #0 to #15 from $D_0$ to $D_{15}$, respectively, there is only one of these memories #0 to #15 to which the write enable signal is supplied. In that one small memory, the data is written into the bit corresponding to the word addresses $A_4$ to $A_{15}$.

Figure 4A:
FIG. 4a and 4b are illustrations showing the positional relationship of address, bit, and word in the memory shown in FIG. 3.
Figure 4A:
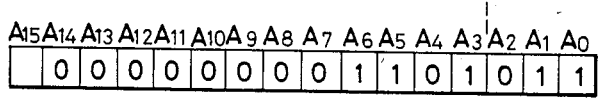

Referring to FIG. 4 there is shown an example of addresses that may be utilized in the present embodiment. FIG. 4a is a construction diagram for the address data used for the case of an access with 1-bit width. The content of the upper portion $A_4$ to $A_{15}$ respresents the word address of the memory 32, and in this example the word at address 13 is the one to be accessed. The content of the lower portion $A_0$ to $A_3$ indicates the one bit in the word to be accessed. In concrete terms, it is for indicating which one of the small memories (that is, it indicates which one of the write enable signals $WE_0$ to $WE_{15}$ is to be turned on), and in the case of the figure, $WE_4$ which this connected to the small memory #4 will be turned on. When this is translated into the positions for the word and bit, the data will be written into the fourth bit.

Figure 4B:

Although descriptions have been given in the foregoing for the cases of bit widths of 16 and one bits, the present embodiment should not be limited of course only to these values, and is also applicable to the cases of 2-bit width, 4-bit width, and so forth. In FIG. 4b, there is shown a diagram illustrating an example of construction of addresses to be used in the case of access with 2-bit width in a word. In that case, the word addresses are shown by the content of the addresses $A_3$ to $A_{14}$, and the bit addresses, that is, the two write enable signals 54 to be turned on, are shown by $A_0$ to $A_2$ (here, $A_{15}$ is not needed). In the example, the bit for address 13 in the small memories is shown, and the content of $A_0$ to $A_2$ shows that the write enable signal lines $WE_7$ and $WE_8$ are to be turned on. When this is translated into the positions of word and bit, it shows that it corresponds to the fourth 2-bit from the left end of address 13 (precisely the seventh and eighth bits). In this case of access with 2-bit width, the data for the 2-bit groups are sent to the data bus (in this case, they may be sent as identical eight sets of 2-bit data or as a single set), and the input and output circuit 42 shown in FIG. 2 inputs the 2-bit data to each of ($D_0D_1$), ($D_2D_3$), ..., and ($D_{14}D_{15}$) of the memory 32.

Figure 5:
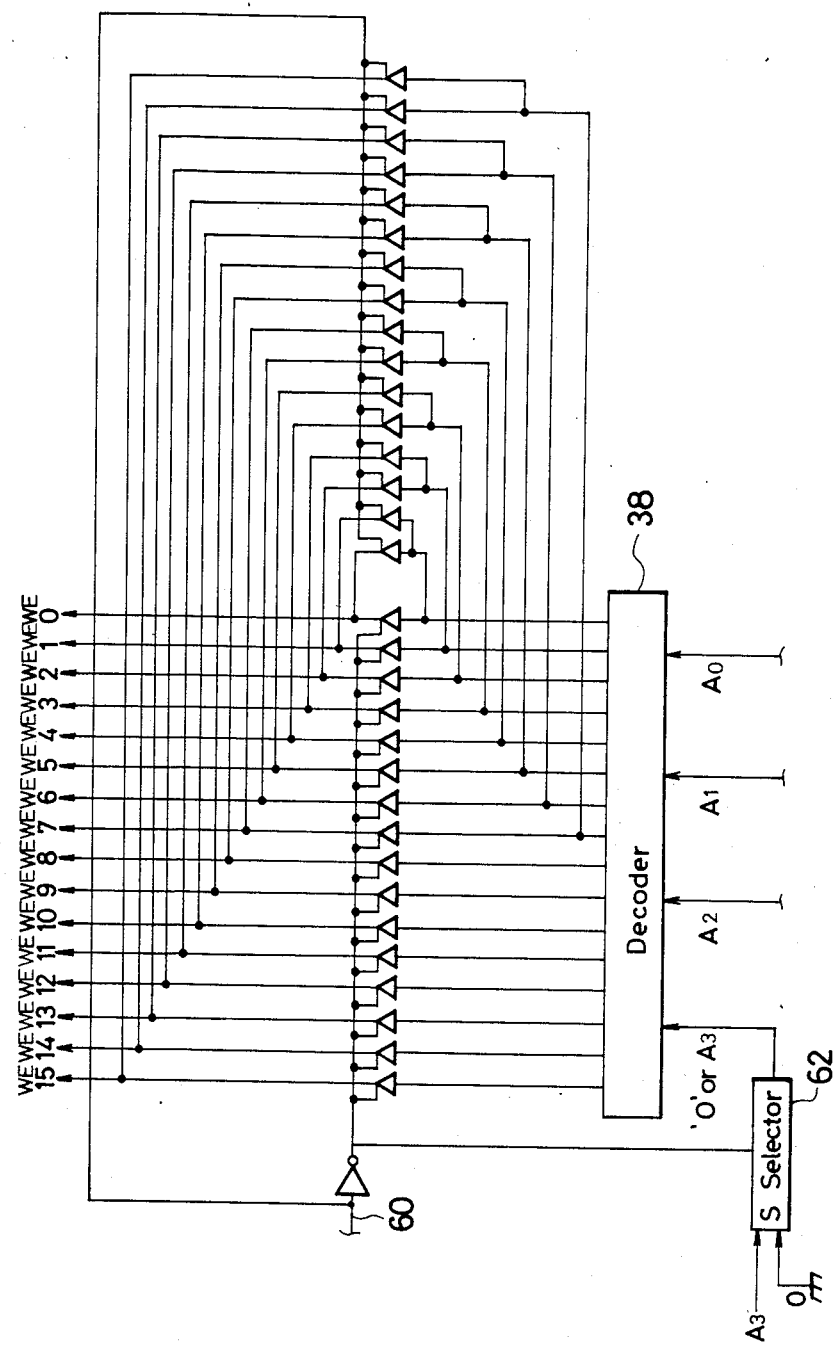
FIG. 5 is an internal construction diagram for the decoder in the case of access with 2-bit width.

In FIG. 5 there is shown an internal construction of the decoder 38 which may be used for both cases of access with 2-bit width and with 1-bit width by switching between the two. In the case of signal "1" which is inputted from the signal line 60, it designates the 2-bit width, while in the case of signal "0" it designates the 1-bit width. When the signal "0" is inputted to a selector 62 which is grounded, the signal "0" is sent to the decoder 38. When the signal "1" is inputted to the selector 62, the address $A_3$ is sent to the decoder 38. If "000" is inputted for the address $A_2A_1A_0$, for example, $WE_0$ alone is turned on by the decoder, but both of $WE_0$ and $WE_1$ are connected to the memory by the date. For the case when an access with a plurality of bits is desired a device may be constructed in a similar manner.

The present invention is not limited to the embodiment described in the foregoing, and can also be applied to the case of reading data memorized in the memory. In the operation for that case, the R/W signal line 56 in FIG. 2 supplies a read indication signal to the input and output circuit 42. Supplied also to the input and output circuit 42 are the addresses $A_3$-$A_0$ that are outputted to the decoder 38 (in the case of 1-bit width). Although the corresponding address bits in the small memories #0 to #15 are selected by the address output line 51 similarly to the case of writing, the input and output circuit 42 sends only the 1-bit data represented by the addresses $A_3$-$A_0$ to the read data bus through one of the lines $D_0$ to $D_{15}$. Though the situation in which the addresses $A_3$-$A_0$ are output to the input and output circuit 42 is not illustrated in FIG. 2, it will also suffice by simply outputting through $D_0$ to $D_{15}$ the 16-bit data for the small memories #0 to #15 that are selected by the address output line 51.

Furthermore, although it is arranged in this embodiment to have the decoder control the write enable signals for writing, it may be replaced by one in which it controls the chip select signals instead.

Various modifications will become possible for those skilled in the art after receiving the teachings of the present disclosure without departing from the scope thereof.

What is claimed is:
1. A memory system, comprising:
a memory consisting of a plurality of bit memory cells, each capable of being independently accessible and of storing bit data in at least a first and second different predetermined bit width access modes;
multiplexer means for receiving addresses corresponding to each access mode and for selectively producing at least first and second predetermined address bit portions out of each of the addresses for applying each of said first and second address bit portions to said memory in accordance respectively with said first and second predetermined bit width access modes;

address decoder means connected between said multiplexer means and said memory for receiving another predetermined address bit portion for at least said first access mode and for decoding said other predetermined address bit portion for producing a first write control signal for designating at least one particular bit to be accessed;

a bit width register for receiving a bit width designating signal in said second access mode and for producing a second write control signal when said second bit width access mode is to be performed; and said memory connected for receiving said first and second write control signals in said first and second access modes respectively for writing therein data having respectively a first and a different second bit width.

2. The memory system as claimed in claim 1, wherein said predetermined bit width access modes consists of at least a 16-bit width, a 1-bit width, a 2-bit width, a 4-bit width access, and an 8-bit width access mode.

3. The memory system as claimed in claim 1, wherein said second predetermined address bit portion is $A_0$–$A_{11}$ which designates a particular word stored in said memory, when a 16-bit width access mode is performed.

4. The memory system as claimed in claim 1, wherein said first predetermined address bit portion is $A_4$–$A_{15}$ which designates a particular word stored in said memory when a 1-bit width access mode is performed.

5. The memory system as claimed in claim 4, wherein said other predetermined address bit portion is $A_0$–$A_3$ which designates at least one particular bit when the 1-bit width access is performed.

6. The memory system as claimed in claim 1, wherein said first bit width access mode is the 16-bit width access while said second bit width access mode is the 1-bit width access.

* * * * *